(12) United States Patent
Kuo

(10) Patent No.: US 6,555,866 B1
(45) Date of Patent: Apr. 29, 2003

(54) NON-VOLATILE MEMORY AND FABRICATION THEREOF

(75) Inventor: Tung-Cheng Kuo, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/112,312

(22) Filed: Mar. 27, 2002

(30) Foreign Application Priority Data

Mar. 8, 2002 (TW) ........................................ 91104343 A

(51) Int. Cl.⁷ .............................................. H01L 29/76
(52) U.S. Cl. ...................... 257/314; 257/315; 257/261; 257/298
(58) Field of Search ................................. 257/314, 315, 257/261, 298

(56) References Cited

U.S. PATENT DOCUMENTS 6,261,905 B1 * 7/2001 Chen et al. ................. 438/264
6,468,865 B1 * 10/2002 Yang et al. ................. 438/262

* cited by examiner

*Primary Examiner*—David Nelms
*Assistant Examiner*—Tu-Tu Ho
(74) *Attorney, Agent, or Firm*—J. C. Patents

(57) ABSTRACT

A non-volatile memory and the fabrication thereof are described. The non-volatile memory comprises a substrate having a trench therein, a buried bit-line in the substrate crossing the trench, a word-line covering at least the trench and crossing over the buried bit-line, and a charge trapping layer between the substrate and the word-line.

12 Claims, 5 Drawing Sheets

NON-VOLATILE MEMORY AND FABRICATION THEREOF

CROSS-REFERENCE TO RELATED APPLICATION

This application claims the priority benefit of Taiwan application serial no. 91104343, filed Mar. 8, 2002.

BACKGROUND OF THE INVENTION

1. Field of Invention

The present invention relates to a semiconductor device and the fabrication thereof. More particularly, the present invention relates to a non-volatile memory (NVM) and the fabrication thereof.

2. Description of Related Art

The family of the non-volatile memory includes the substrate/oxide/nitride/oxide/silicon (SONOS) memory. The structure of a conventional SONOS non-volatile memory is schematically illustrated in FIG. 1 in a cross-sectional view.

Refer to FIG. 1, the SONOS memory comprises a substrate 100, a word-line 112 on the substrate 100, an oxide/nitride/oxide (ONO) layer 104 as a charge trapping layer between the substrate 100 and the word-line 112, a buried bit-line 108 in the substrate 100 beside the ONO layer 104, and a buried bit-line oxide layer 110 between the buried bit line 108 and the word line 112. A channel region (not shown) is thus defined in the substrate 100 under the charge trapping layer 104.

Since the channel region in a conventional SONOS non-volatile memory is flat, the channel width decreases as the memory cell is scaled down and the channel current is thus decreased. Therefore, the difference between the "On" current and the "Off" current, which is equal to the difference between the channel current at the logic state "0" and the channel current at the logic state "1", is decreased and data-reading errors easily occurs.

SUMMARY OF THE INVENTION

Accordingly, this invention provides a non-volatile memory and the fabrication thereof to avoid the channel current from being decreased when the memory cell is scaled down, or to increase the channel current in a memory cell of the same size.

This invention also provides a non-volatile memory and the fabrication thereof to provide a sufficient difference in the channel current between the "0" state and the "1" state when the memory cell is miniaturized, or to increase the difference between the "0" state and the "1" state in a memory cell of the same size.

The non-volatile memory of this invention comprises a substrate having a trench therein, a buried bit-line crossing the trench, a word-line covering at least the trench and crossing over the buried bit-line, and a charge trapping layer between the substrate and the word-line. Moreover, a buried bit-line oxide layer is disposed between the buried bit-line and the word-line.

The fabrication of the non-volatile memory of this invention comprises the following steps. A trench, such as a U-shaped trench, is formed in a substrate and then a charge trapping layer is formed on the substrate and on the trench. A lithography process and an etching process are performed to expose a strip region of the substrate crossing the trench. A buried bit-line is formed in the substrate within the region and then a buried bit-line oxide layer is formed on the buried bit-line. Subsequently, a word-line is formed covering the trench and crossing over the buried bit-line.

Since the word-line extends along the trench and crosses over the buried bit-line in the non-volatile memory of this invention, the channel has a curved cross section and the effective channel width is thus increased. Therefore, the channel current is increased and the difference between the "0" state and the "1" state or between the "On" current and the "Off" current is larger.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In the preferred embodiment of this invention, a SONOS non-volatile memory and the fabrication thereof are described.

Figure 2A:
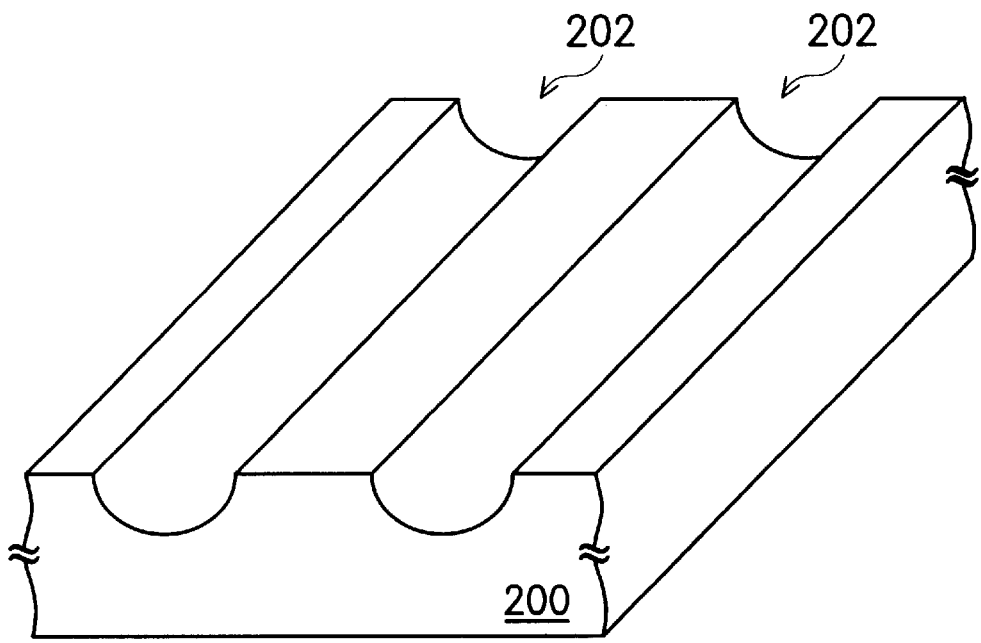
FIGS. 2A~2F illustrate the process flow of fabricating a SONOS non-volatile memory according to a preferred embodiment of this invention.

Refer to FIG. 2A, a trench 202, such as a U-shaped trench, is formed in a substrate 200. The trench 202 can be formed by anisotropic etching with a patterned photoresist layer as a mask.

Figure 2B:
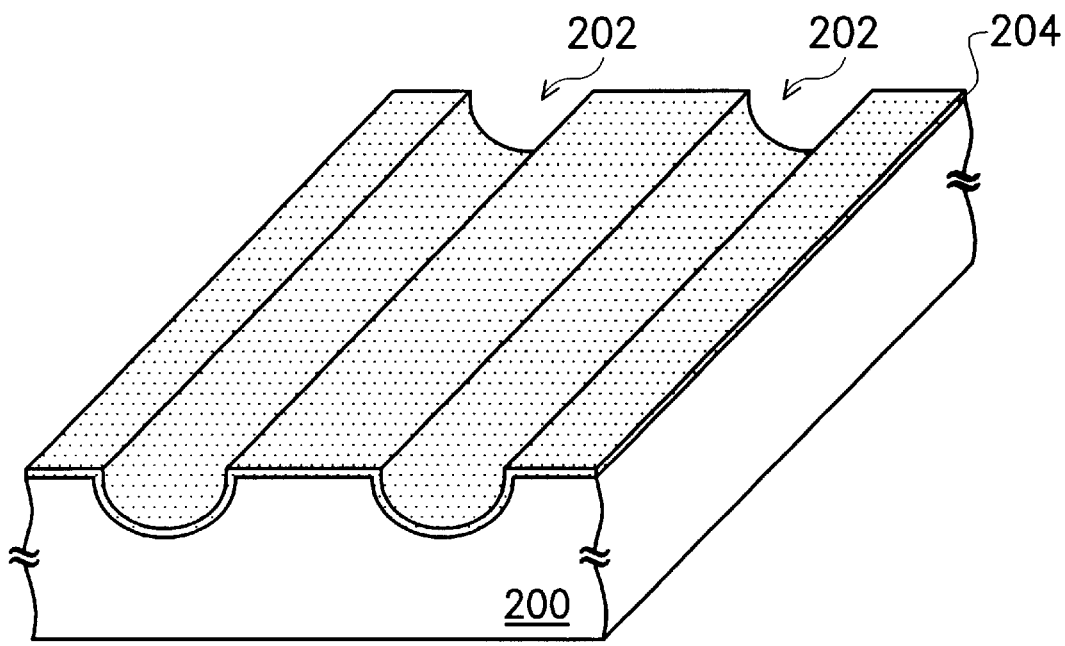

Refer to FIG. 2B, a charge trapping layer 204 is formed on the substrate 200 and on the trench 202. The charge trapping layer 204 comprises, for example, an oxide/nitride/oxide (ONO) layer. To fabricate the ONO layer, for example, a silicon oxide is formed on the substrate 200 within a furnace, a silicon nitride layer is formed on the silicon oxide layer by low pressure chemical vapor deposition (LPCVD), and another silicon oxide layer is formed on the silicon nitride layer by another thermal oxidation process.

Figure 2C:
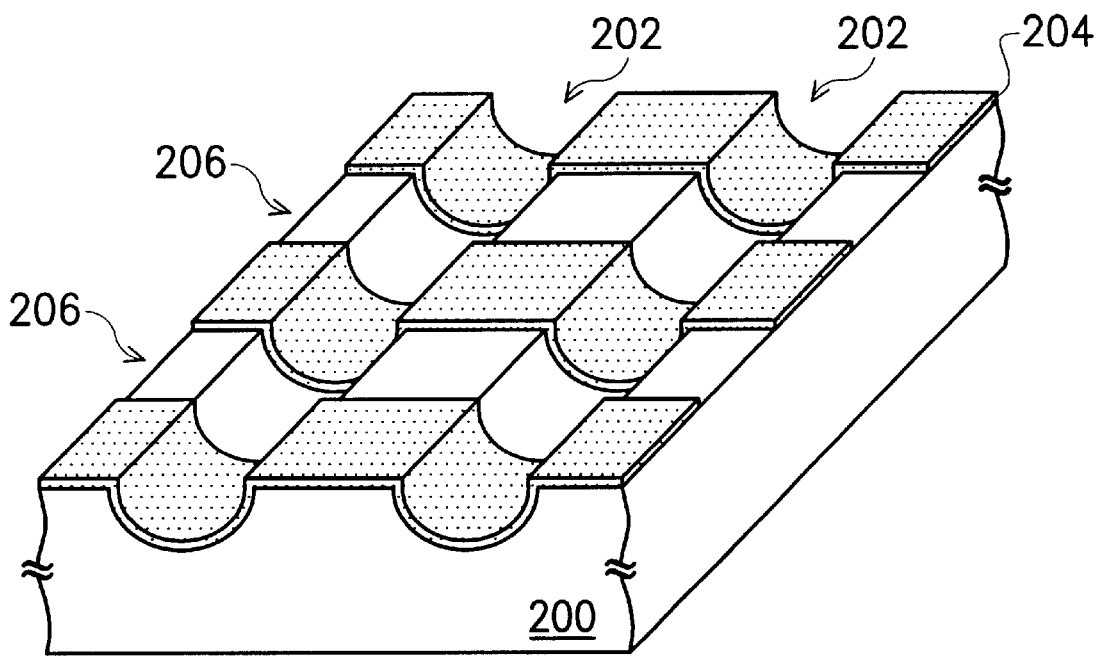

Refer to FIG. 2C, a portion of the charge trapping layer 204 is removed by lithography and etching techniques to expose a strip region 206 that crosses the trench 202.

Figure 2D:
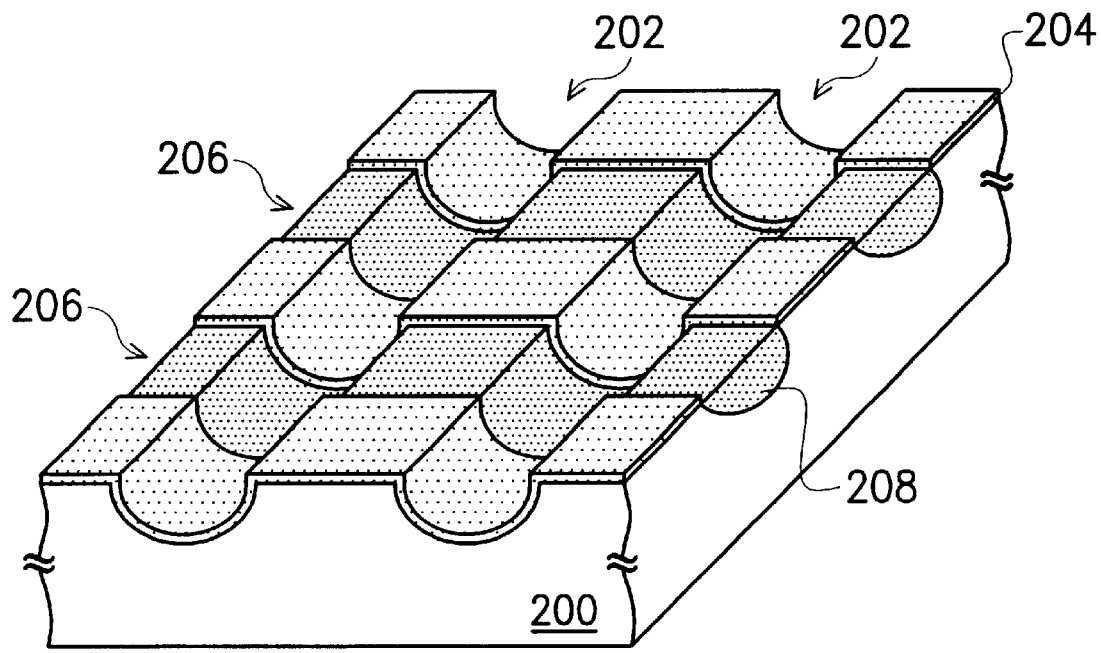

Refer to FIG. 2D, a buried bit-line 208 is formed in the substrate 200 within the strip region 206 by, for example, ion implantation.

Figure 2E:
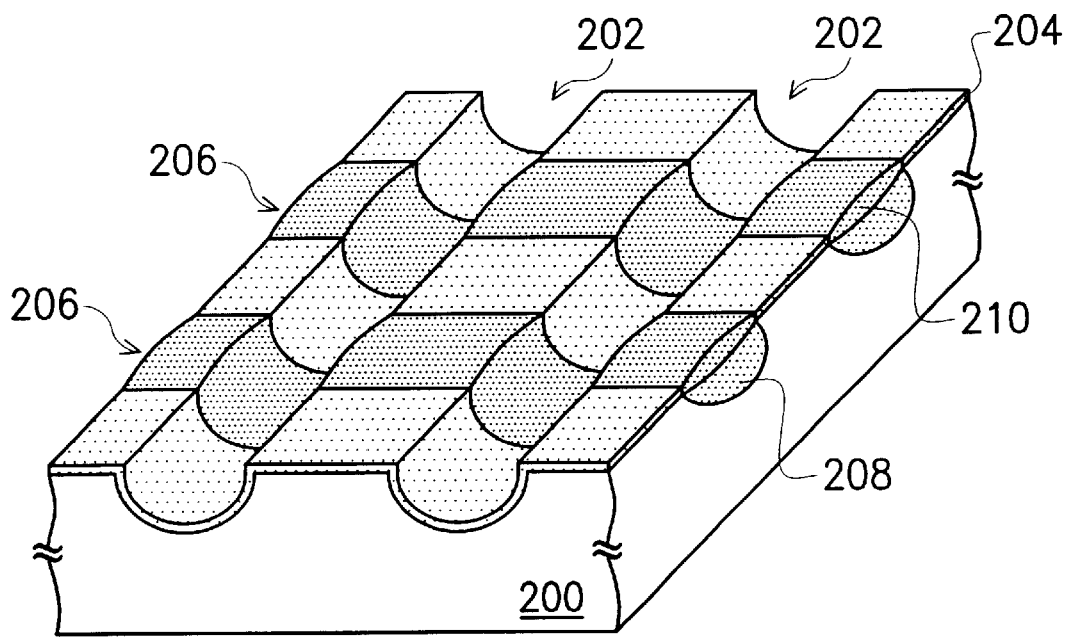

Refer to FIG. 2E, a buried bit-line oxide layer 210 is formed on the buried bit-line 208 by, for example, thermal oxidation in a furnace.

Figure 1:
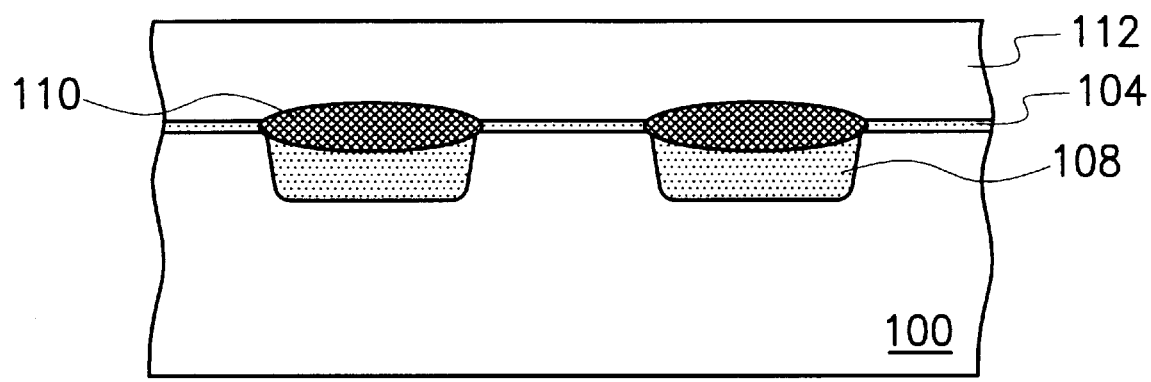
FIG. 1 illustrates a conventional SONOS memory in a cross-sectional view.
Figure 2F:
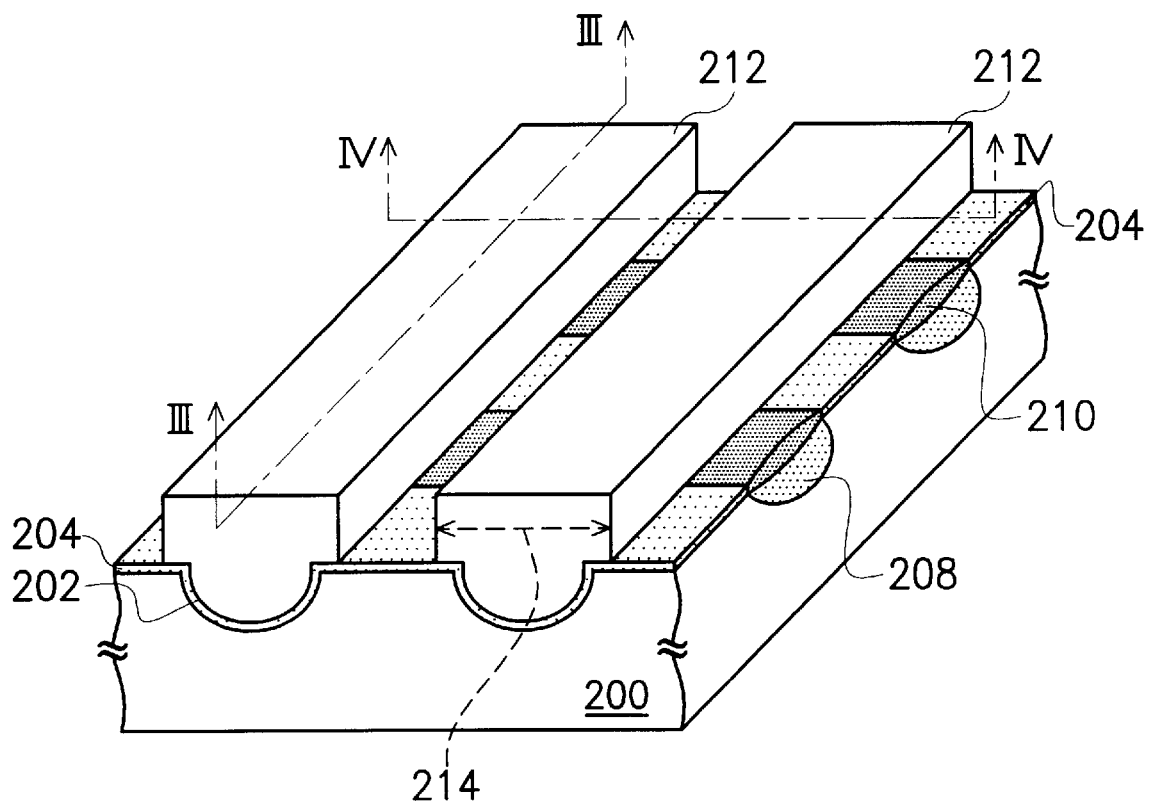

Refer to FIG. 2F, a word-line (W/L) 212, such as a polysilicon word-line, is formed covering the trench 202 and crossing over the buried bit-line 208. The width 214 of the word-line 212 can be the same as that of the word-line 112 of the conventional SONOS memory illustrated in FIG. 1.

Since the word-line 212 is formed over the trench 202, the channel has a curved cross section. Consequently, the effective channel width and the channel current are increased with the same size of the memory cell.

Figure 3:
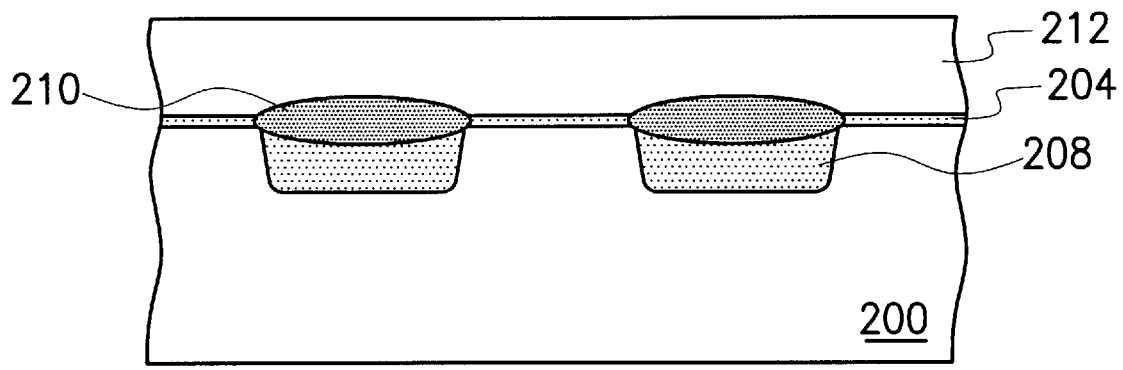
FIG. 3 depicts a cross section of the SONOS non-volatile memory illustrated in FIG. 2F along the line III—III.
Figure 4:
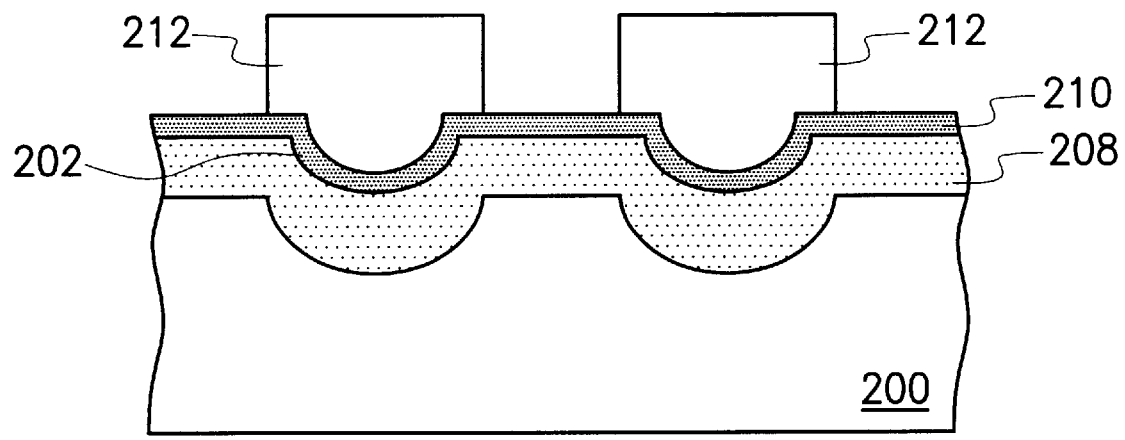
FIG. 4 depicts a cross section of the SONOS non-volatile memory illustrated in FIG. 2F along the line IV—IV.

Refer to FIGS. 3–4 to further understand the structure of the SONOS memory according to the preferred embodiment of this invention, wherein FIGS. 3 and 4 depict two cross sections of the SONOS non-volatile memory illustrated in FIG. 2F along the line III—III and along the line IV—IV, respectively.

Refer to FIG. 3, the charge trapping layer 204 is disposed between the substrate 200 and the word-line 212. The buried bit-line 208 is located in the substrate 200 beside the charge trapping layer 204. The buried bit-line oxide layer 210 is disposed between the buried bit-line 208 and the word-line 212.

Refer to FIG. 4, the buried bit-line 208 is located in the substrate 200 perpendicular to the trench 202. The trench 202 is covered by the word-line 212 that crosses over the buried bit-line 208.

Since the word-line extends along the trench and crosses over the buried bit-line in the SONOS non-volatile memory according to the preferred embodiment of this invention, the channel has a curved cross section and the effective channel width is increased with the same size of the memory cell. Therefore, the channel current is increased and the difference between the "0" state and the "1" state or between the "On" current and the "Off" current is larger.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A non-volatile memory, comprising:
   a substrate having a trench therein;
   a buried bit-line in the substrate crossing the trench;
   a word-line covering at least the trench and crossing over the buried bit-line; and
   a charge trapping layer between the substrate and the word-line.

2. The non-volatile memory of claim 1, wherein the trench comprises a U-shaped trench.

3. The non-volatile memory of claim 1, wherein the charge trapping layer comprises a silicon oxide/silicon nitride/silicon oxide (ONO) layer.

4. The non-volatile memory of claim 1, further comprising a buried bit-line oxide layer between the buried bit-line and the word-line.

5. The non-volatile memory of claim 1, wherein the word-line comprises polysilicon.

6. A method for fabricating a non-volatile memory, comprising the steps of:
   providing a substrate;
   forming a trench in the substrate;
   forming a charge trapping layer on the substrate and on the trench;
   exposing a strip region of the substrate that crosses the trench;
   forming a buried bit-line in the substrate within the strip region;
   forming a buried bit-line oxide layer on the buried bit-line; and
   forming a word-line over the substrate, the word line covering the trench and crossing over the buried bit-line.

7. The method of claim 6, wherein the trench comprises a U-shaped trench.

8. The method of claim 7, wherein the method for forming the trench comprises anisotropic etching.

9. The method of claim 6, wherein the charge trapping layer comprises a silicon oxide/silicon nitride/silicon oxide (ONO) layer.

10. The method of claim 9, wherein forming the ONO layer on the substrate comprises:
    forming a first silicon oxide layer on the substrate by thermal oxidation;
    forming a silicon nitride layer on the first silicon oxide layer by low pressure chemical vapor deposition (LPCVD); and
    forming a second silicon oxide layer on the silicon nitride layer by thermal oxidation.

11. The method of claim 6, wherein the method for forming the buried bit-line comprises ion implantation.

12. The method of claim 6, wherein the word-line comprises polysilicon.

* * * * *